(12) United States Patent
Shiu

(10) Patent No.: US 8,193,605 B2
(45) Date of Patent: Jun. 5, 2012

(54) BIPOLAR JUNCTION TRANSISTOR INTEGRATED WITH PIP CAPACITOR AND METHOD FOR MAKING THE SAME

(75) Inventor: Jian-Bin Shiu, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 215 days.

(21) Appl. No.: 12/437,550

(22) Filed: May 7, 2009

(65) Prior Publication Data

US 2010/0283123 A1   Nov. 11, 2010

(51) Int. Cl.
*H01L 21/02*   (2006.01)
(52) U.S. Cl. ............. 257/532; 257/533; 257/E29.175; 438/957
(58) Field of Classification Search .......... 257/E29.175, 257/532
See application file for complete search history.

(56) References Cited

U.S. PATENT DOCUMENTS

| 5,235,335 | A | 8/1993 | Hester et al. |
| 5,338,700 | A | 8/1994 | Dennison et al. |
| 5,952,952 | A | 9/1999 | Choi et al. |
| 5,973,633 | A | 10/1999 | Hester |
| 6,153,899 | A | 11/2000 | Ping |
| 2006/0158268 | A1* | 7/2006 | McCorquodale et al. ...... 331/34 |
| 2007/0099374 | A1 | 5/2007 | Ko |

* cited by examiner

*Primary Examiner* — Ajay K Arora
(74) *Attorney, Agent, or Firm* — Winston Hsu; Scott Margo

(57) ABSTRACT

A bipolar junction transistor (BJT) integrated with a PIP capacitor includes a substrate including a bipolar junction transistor region and a PIP capacitor region, a bipolar junction transistor disposed in the bipolar junction transistor region and extending an isolation layer to the PIP capacitor region and a base poly layer disposed on the isolation layer, and a PIP capacitor disposed in the PIP capacitor region and including a lower poly layer, the isolation layer and the base poly layer to selectively form a PIP capacitor.

10 Claims, 5 Drawing Sheets

BIPOLAR JUNCTION TRANSISTOR INTEGRATED WITH PIP CAPACITOR AND METHOD FOR MAKING THE SAME

BACKGROUND OF THE INVENTION

1. Field of the Invention

The present invention relates to a poly-insulator-poly (PIP) capacitor structure combined with a bipolar junction transistor (BJT), an input RC circuit and the method for forming the two. In particular, the present invention relates to a poly-insulator-poly capacitor structure integrated with a bipolar junction transistor, a tunable input RC circuit and the method for forming the two.

2. Description of the Prior Art

In the conventional metal-oxide-semiconductor (MOS) process, capacitor structures are optionally formed to match the circuit design of the elements. Such capacitor structures are usually a metal-insulator-metal (MIM) capacitor or a metal-insulator-Si capacitor (MIS) capacitor.

Although the MIM capacitor or the MIS capacitor has been used in the traditional MOS process for a long time and is somewhat advantageous, neither the MIM capacitor set nor the MIS capacitor set can provide a code option. Another possible capacitor structure is called poly-insulator-poly (PIP) capacitor. So far, no capacitor has been used in the bipolar complementary metal-oxide-semiconductor (BiCMOS) process.

Accordingly, it is still needed to obtain a novel poly-insulator-poly capacitor structure integrated with a bipolar junction transistor made by the conventional bipolar complementary metal-oxide-semiconductor process. In one aspect, it provides a code option to form a capacitor array or a tunable code array, and in another aspect, it is still compatible with the conventional bipolar complementary metal-oxide-semiconductor process to simplify the process and to lower the cost for manufacturing the poly-insulator-poly capacitor structure integrated with the bipolar junction transistor.

SUMMARY OF THE INVENTION

The present invention therefore proposes a poly-insulator-poly capacitor structure integrated with a bipolar junction transistor. On one hand, because the poly-insulator-poly capacitor structure may be integrated with a bipolar junction transistor, it is of course compatible with the conventional bipolar complementary metal-oxide-semiconductor process to simplify the process and to lower the cost for manufacture the poly-insulator-poly capacitor structure integrated with the bipolar junction transistor. On the other hand, the poly-insulator-poly capacitor structure may further provide a code option, preferably to form a capacitor array.

The present invention first proposes a PIP capacitor structure integrated with a BJT. The PIP capacitor structure integrated with the BJT includes a substrate having a BJT region and a PIP capacitor region, a BJT disposed in the BJT region and including an emitter, a collector, an isolation layer and a base poly layer disposed on the isolation layer for forming a base, and a PIP capacitor disposed in the PIP capacitor region and including a lower poly layer, the isolation layer and the base poly layer both extending to the PIP capacitor region. The lower poly layer, the isolation layer and the base poly layer together selectively form a PIP capacitor structure.

The present invention again proposes a method to form a PIP capacitor structure integrated with a BJT. First, a substrate having a BJT region, a gate region and a PIP capacitor region is provided. Second, a gate material layer is formed to cover the BJT region, the gate region and the PIP capacitor region. Then, the gate material layer is patterned to form a gate structure disposed in the gate region and a lower poly layer in the PIP capacitor region. Later, a BJT disposed in the BJT region is formed. The BJT includes an isolation layer extending onto the lower poly layer and a base poly layer disposed on the isolation layer. The isolation layer is selectively sandwiched between the lower poly layer and the base poly layer to form a PIP capacitor or a dummy capacitor.

Preferably, a salicide layer may be formed in the resistance region and covers the base poly layer. The resistance region is disposed between the BJT region and the PIP capacitor region. The salicide layer has a discontinuous region to define a resistance so that the size of the discontinuous region makes the resistance value of the resistance tunable. In one embodiment of the present invention, the PIP capacitor and the dummy capacitor together form a capacitor array. The capacitor array may further form a tunable code array. In another embodiment of the present invention, the bipolar junction transistor, the poly-insulator-poly capacitor may form an input RC circuit with a resistance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
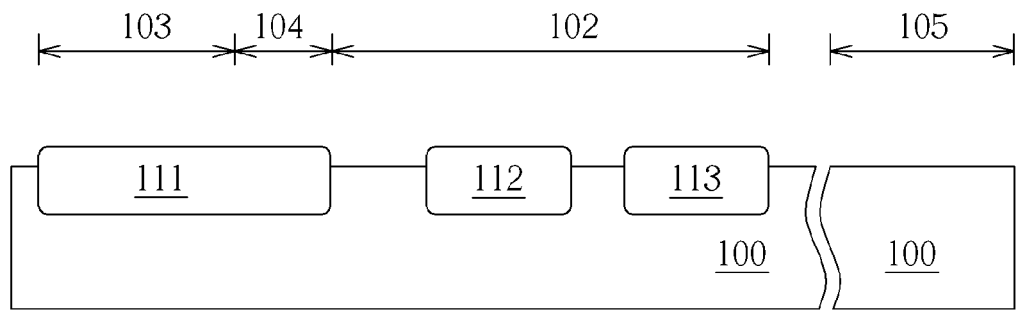
FIGS. 1-3 illustrate an example of the method to form a PIP capacitor structure integrated with a BJT of the present invention.
Figure 2:
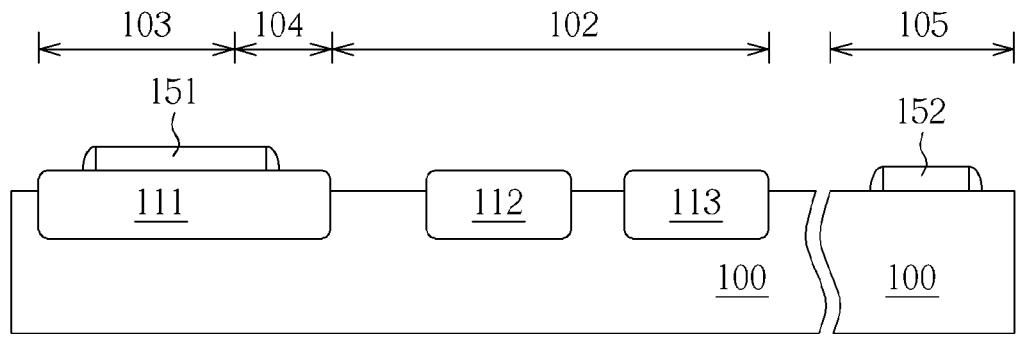

The present invention first provides a method to form a PIP capacitor structure integrated with a BJT, so that a PIP capacitor structure integrated with a BJT may be obtained. FIGS. 1-3 illustrate an example of the method to form a PIP capacitor structure integrated with a BJT of the present invention.

Please refer to FIG. 1, first, a substrate 100 is provided. The substrate 100 of the present invention may be a semi-conductive material, such as Si. The substrate 100 may have different regions, such as a BJT region 102, a PIP capacitor region 103, a resistance region 104, and a gate region 105. The resistance region 104 is disposed between the BJT region 102 and the PIP capacitor region 103. In different regions of the substrate 100, layers of isolating purpose such as a field oxide layer or a shallow trench isolation may be formed in advance. For example, a first field oxide layer 111 is located in the PIP capacitor region 103 and in the resistance region 104. The second field oxide layer 112 and the third field oxide layer 113 is located in the BJT region 102.

Second, a gate material layer is formed to entirely cover the substrate 100, i.e. the BJT region 102, the PIP capacitor region 103, the resistance region 104, and the gate region 105. The gate material layer usually includes a doped polysilicon. Then, as shown in FIG. 2, the gate material layer is patterned to simultaneously form a gate structure 152 disposed in the gate region 105 and a lower poly layer 151 in the PIP capacitor region 103. As known by persons of ordinary skills in the art, there is a gate isolation layer underlying the gate material layer.

Figure 3A:
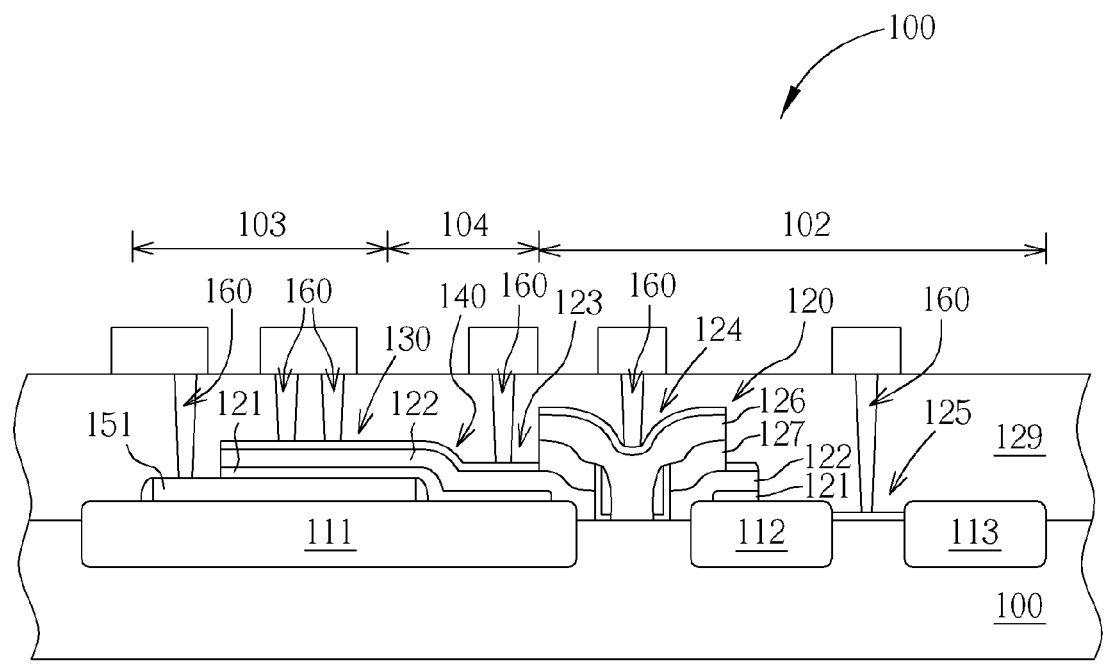
Figure 3B:
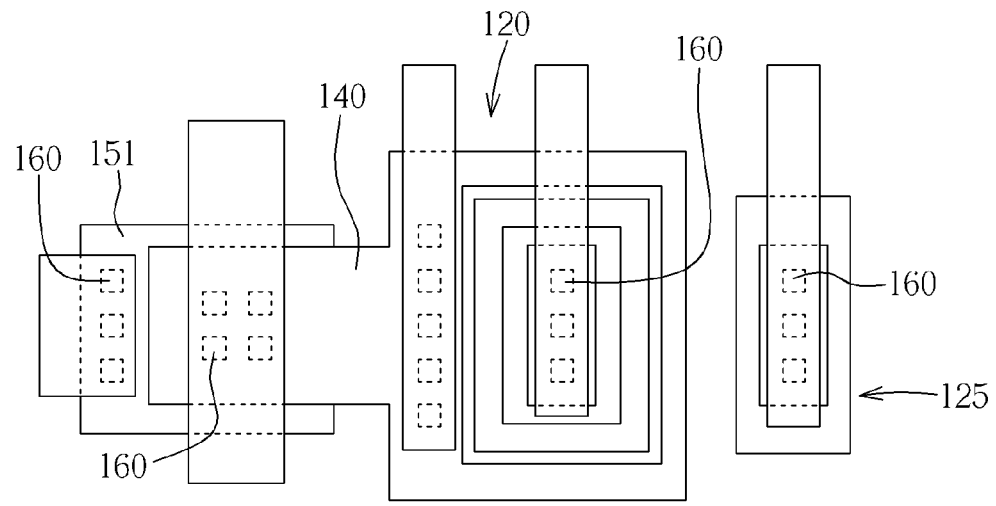

Later, as shown in FIG. 3A, a BJT 120 is formed in the BJT region 102. The BJT 120 includes a base 123, an emitter 124, and a collector 125. The method to manufacture the BJT 120 is known by persons of ordinary skills in the art and the details will not be discussed here. FIG. 3B illustrates a top view.

The BJT 120 in the BJT region 102 may be composed of multiple layers. For example, there are a base poly layer 122, and an emitter poly layer 126. As shown in FIG. 3A, in addition to being located in the BJT region 102, the base poly layer 122 of the present invention may extend to the PIP capacitor region 103 through the resistance region 104, so that the base poly layer 122 is located in the PIP capacitor region 103, too. There is an insulation layer 127 sandwiched between the emitter poly layer 126 and the base poly layer 122, and an isolation layer 121 sandwiched between the base poly layer 122 and the lower poly layer 151, to electrically segregate one another.

In addition to being located in the BJT region 102, the isolation layer 121 may extend to the PIP capacitor region 103 through the resistance region 104, so that the isolation layer 121, like the base poly layer 122, is located in the PIP capacitor region 103, too. The base poly layer 122 is disposed on the isolation layer 121, and the isolation layer 121 is disposed on the lower poly layer 151, so that part of the base poly layer 122 and part of the isolation layer 121 extending to the PIP capacitor region 103 and the lower poly layer 151 respectively becomes the upper electrode, the capacitor dielectric layer and the lower electrode of the PIP capacitor 130. In the present example, the lower poly layer 151, the base poly layer 122 and the emitter poly layer 126 may usually include polysilicon. The insulation layer 127 as well as the isolation layer 121 may include nitride, oxide or oxynitride.

Following, as shown in FIG. 3A, a dielectric layer 129 is formed to cover the BJT 120, the base poly layer 122 and the lower poly layer 151. Moreover, some contact plugs 160 are formed to respectively construct the electrical connection of the BJT 120, of the base poly layer 122 and of the lower poly layer 151. The method to construct the contact plugs 160 is known by persons of ordinary skills in the art and the details will not be discussed here.

Please note that because the BJT 120 and the PIP capacitor 130 share the base poly layer 122 and the isolation layer 121, the PIP capacitor structure 130 of the present invention can be manufacturingly integrated with the BJT 120 so it is compatible with the current bipolar complementary metal-oxide-semiconductor process. In such a way, the present invention may simplify the process and the cost for manufacturing the PIP capacitor 130 and elevate the integration efficiently.

In addition, the isolation layer 121 of the present invention may be selectively sandwiched between the base poly layer 122 and the lower poly layer 151 in accordance with the etching procedure of the isolation layer 121, that is, the present invention may readily use the reticle pattern which defines the isolation layer 121 to determine if the PIP capacitor 130 is formed or not. Accordingly, the PIP capacitor structure 130 of the present invention may also provide a code option or to form a capacitor array.

Figure 4A:
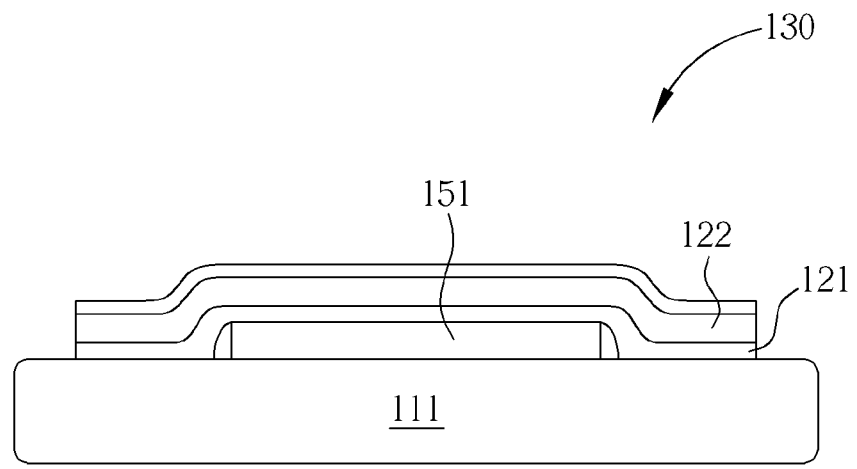
FIG. 4A illustrates a preferred example of the isolation layer, the base poly layer and the lower poly layer of the present invention constructing the PIP capacitor structure.
Figure 4B:
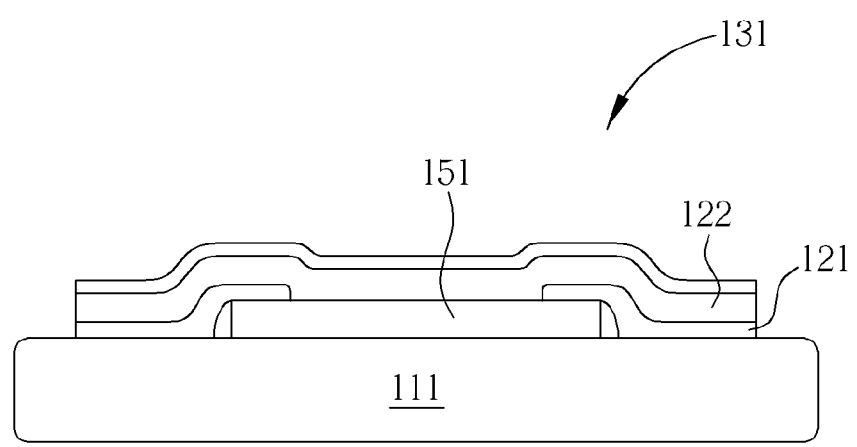
FIG. 4B illustrates an example of the base poly layer and the lower poly layer of the present invention short circuiting and not constructing the PIP capacitor structure.

Please refer to FIGS. 4A and 4B. FIG. 4A illustrates a preferred example of the isolation layer 121, the base poly layer 122 and the lower poly layer 151 of the present invention constructing the PIP capacitor structure 130. FIG. 4B illustrates a preferred example of the base poly layer 122 and the lower poly layer 151 of the present invention short circuiting and not constructing the PIP capacitor structure 130. The tern "selectively" means that an opening is optionally formed on the isolation layer 121 so that the base poly layer 122 and the lower poly layer 151 of the present invention are short circuiting and do not construct the PIP capacitor structure 130. The selectivity is up to the circuit design of the elements.

Because the base poly layer 122 and the lower poly layer 151 of the present invention may be short circuiting, the base poly layer 122 and the lower poly layer 151 in FIG. 4B may be deemed as a "dummy" capacitor 131 which does not function as a normal capacitor. In other words, the "dummy" capacitor 131 may be optionally or selectively formed. Because both the isolation layer 121 and the base poly layer 122 in the PIP capacitor region 103 come from the BJT 120, the PIP capacitor structure 130 is defined to be a dummy capacitor 131 or not when the BJT 120 is defined.

Further, in order to construct an input RC circuit, the base poly layer 122 passing through the resistance region 104 may serve as a resistance 140 in the resistance region 104. For example, before the formation of the contact plugs 160, salicide to lower the contact resistance is formed in advance on the surface of the base poly layer 122. So, the resistance 140 may be synchronously formed in the resistance region 104 during the formation of the salicides and makes it compatible with the current bipolar complementary metal-oxide-semiconductor process.

Figure 5:
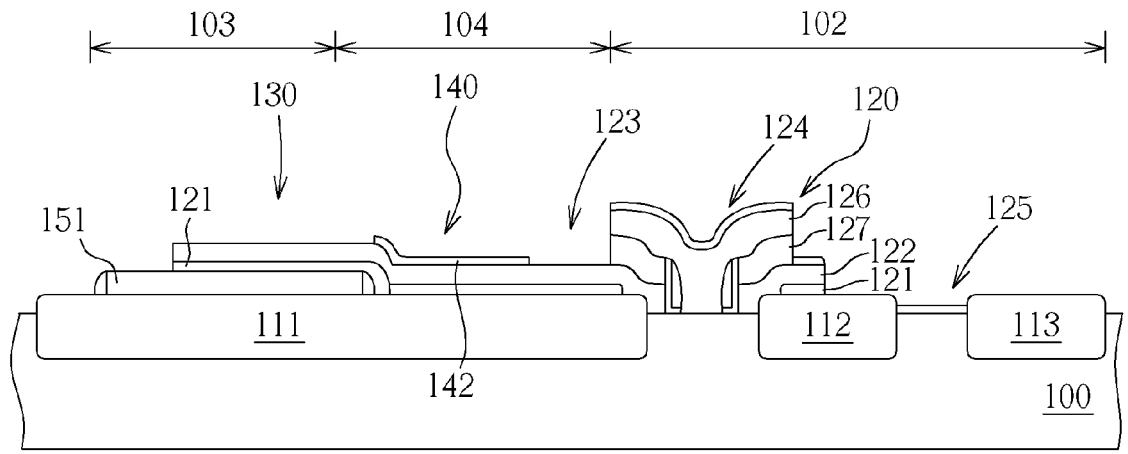
FIGS. 5-7 illustrate an example of the formation of the resistance of the present invention.

The formation of the resistance 140 may be as follows. First, please refer to FIG. 5, a patterned salicide block (SAB) layer 142 is formed. The patterned salicide block layer 142 defines the region which has no salicide on the substrate 100, for example, the base poly layer 122 serving as a resistance 140 in the resistance region 104. The size of the salicide block layer 142 in the resistance region 104 is related to the resistance value of the resistance 140. The salicide block layer 142 may include nitride, oxide or oxynitride.

Figure 6:
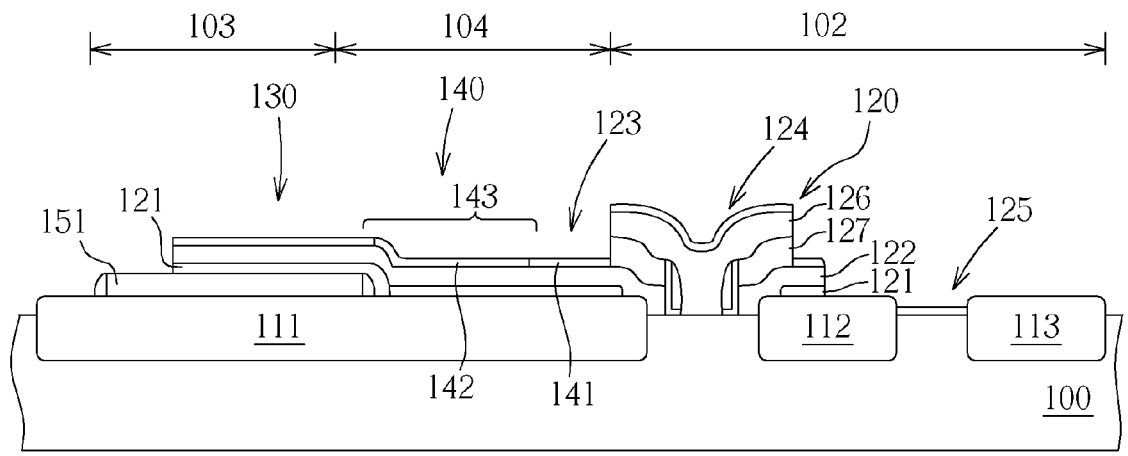
Figure 7:
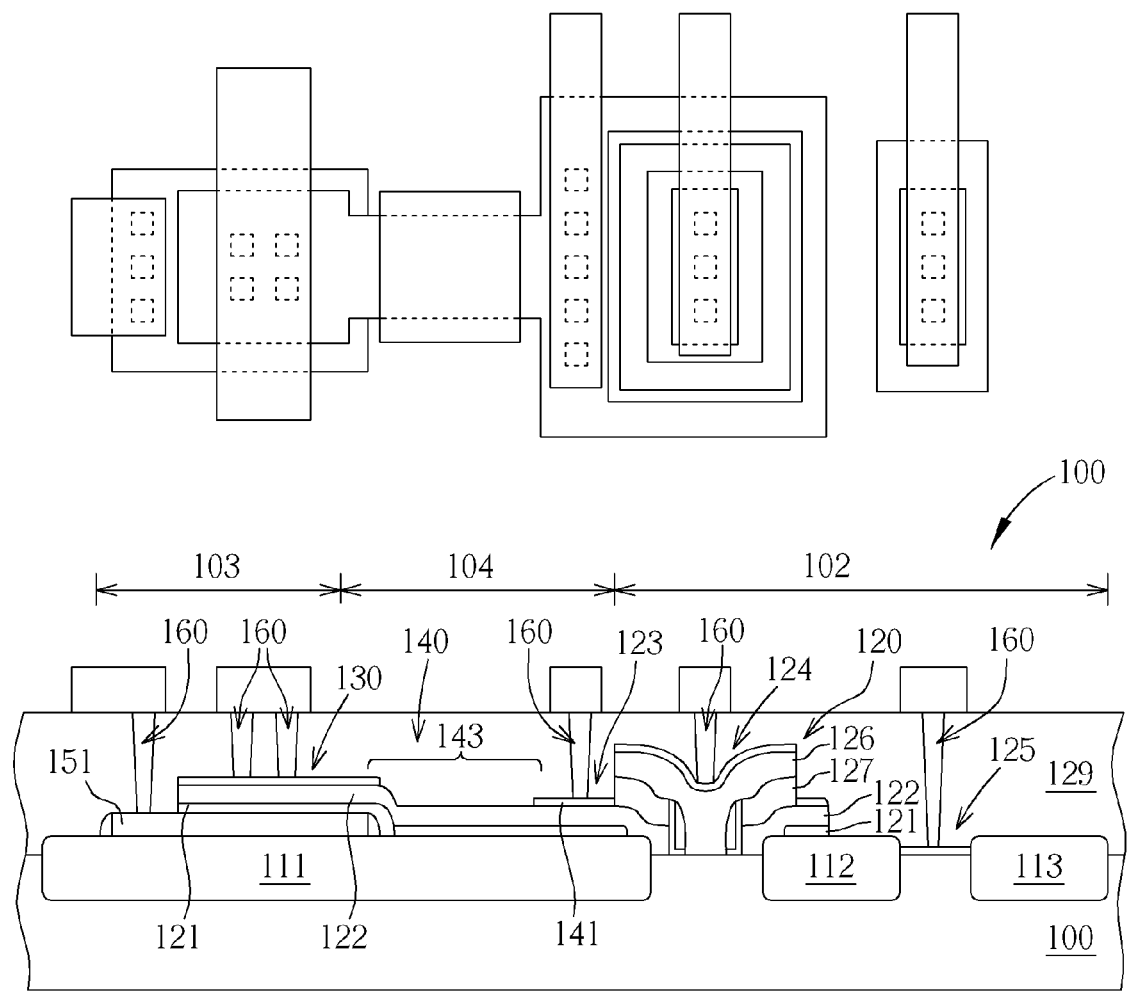

Later, please refer to FIG. 6, a salicide layer 141 is formed on the polysilicon region, such as the base poly layer 122 in the resistance region 104, by the convention self-aligning salicide procedure. Due to the blockage of the salicide block layer 142, the salicide layer 141 now has a discontinuous region 143 about the size of the salicide block layer 142 on the surface of the base poly layer 122. In other words, the salicide block layer 142 roughly defines the size of the discontinuous region 143 of the salicide layer 141 and further defines the resistance value of the resistance 140. Accordingly, the length of the discontinuous region 143 may be adjusted to adjust the resistance value of the resistance 140 and to make the resistance 140 a tunable resistance. Optionally, the salicide block layer 142 may be removed after the self-aligning salicide procedure, as shown in FIG. 7.

In view of the above, a poly-insulator-poly capacitor structure integrated with a bipolar junction transistor is therefore obtained. FIG. 3A illustrates an example of the PIP capacitor structure integrated with a BJT of the present invention. The PIP capacitor structure 130 integrated with a BJT of the present invention includes a substrate 100, a BJT 120 and a PIP capacitor 130. The BJT 120 in the BJT region 102 includes a base 123, an emitter 124, and a collector 125 composed by an insulation layer 127, a base poly layer 122, an isolation layer 121, an emitter poly layer 126 and the substrate 100. Part of the base poly layer 122 and part of the isolation layer 121 extending to the PIP capacitor region 103 as well as the lower poly layer 151 respectively becomes the upper electrode, the capacitor dielectric layer and the lower electrode of the PIP capacitor 130. The BJT 120 and the PIP capacitor 130 are substantially connected to each other by means of part of the base poly layer 122 and part of the isolation layer 121 extending to the PIP capacitor region 103.

In addition, please refer to FIGS. 4A and 4B. The base poly layer 122 and the lower poly layer 151 of the present invention may be short circuiting by adjusting the patterning procedure of the isolation layer 121 and do not construct the PIP capacitor structure 130. The base poly layer 122, the isolation layer 121 and the lower poly layer 151 may be considered to selectively from a "dummy" capacitor 131. Accordingly, a normal capacitor, such as the PIP capacitor 130 or other capacitors, may be electrically connected to a dummy capacitor, such as the dummy capacitor 131 or other dummy capacitors, to form a collective to construct a capacitor array. The capacitor array may be manufactured in a great number to lower the cost. That is, the present invention may readily use the reticle pattern which defines the isolation layer 121 to determine different capacitance. Furthermore, the present invention provides a tunable capacitor array due to the combination of the PIP capacitor 130 and the dummy capacitor 131 in the collective. Usually, the more PIP capacitors 130 there are, the more capacitance there is. In other words, the more dummy capacitors 131 there are, the less capacitance there is.

Besides, the capacitor array of the present invention may form a tunable code array through the proper combination of the PIP capacitor 130 and the dummy capacitor 131. For example, the PIP capacitor 130 and the dummy capacitor 131 in the tunable code array may be considered as the combination of 0 and 1.

In another embodiment of the present invention, the BJT 120, the PIP capacitor 130 and the resistance 140 together form an input RC circuit. Such input RC circuit may have high impedance and better noise immunity. As shown in FIGS. 6 and 7, the base poly layer 122 in the resistance region 104 without the salicide layer 141, i.e. the discontinuous region 143, forms an equivalent resistance 140 in the resistance region 104. Because the electrical conduction between the BJT 120 and the PIP capacitor 130 substantially relies on the salicide layer 141 of low resistance, the size of the discontinuous region 143 in the resistance region 104 is related to the resistance value of the resistance 140 between the BJT 120 and the PIP capacitor 130. Usually, the longer or the larger the resistance region 104 is, the larger the resistance value is. Accordingly, the resistance 140 becomes a tunable resistance. Moreover, because the BJT region 102, the PIP capacitor region 103, and the resistance region 104 are tightly close to each other, the area occupied by the input RC circuit is smaller therefore the space available for other elements is increased.

Those skilled in the art will readily observe that numerous modifications and alterations of the device and method may be made while retaining the teachings of the invention.

What is claimed is:

1. A poly-insulator-poly (PIP) capacitor structure integrated with a bipolar junction transistor (BJT), comprising:
    a substrate having a BJT region and a PIP capacitor region;
    a BJT disposed in said BJT region and comprising an emitter, a collector, an isolation layer and a base poly layer disposed on said isolation layer for forming a base; and
    a PIP capacitor structure disposed in said PIP capacitor region and comprising a lower poly layer, said isolation layer and said base poly layer both extending to said PIP capacitor region to selectively form said PIP capacitor structure.

2. The PIP capacitor structure integrated with the BJT of claim 1, wherein said substrate further comprises a resistance region between said BJT region and said PIP capacitor region for said base poly layer to form a resistance in said resistance region.

3. The PIP capacitor structure integrated with the BJT of claim 2, further comprising:
    a silicide layer having a discontinuous region and partially covering said base poly layer.

4. The PIP capacitor structure integrated with the BJT of claim 3, further comprising:
    a salicide block (SAB) layer disposed in said discontinuous region.

5. The PIP capacitor structure integrated with the BJT of claim 3, wherein the size of said discontinuous region defines the resistance value of said resistance.

6. The PIP capacitor structure integrated with the BJT of claim 1, wherein said BJT, said lower poly layer and said base poly layer respectively electrically connect to a contact plug.

7. The PIP capacitor structure integrated with the BJT of claim 1, wherein said lower poly layer and said base poly layer are short circuiting to form a dummy capacitor.

8. The PIP capacitor structure integrated with the BJT claim 1, wherein said lower poly layer, said isolation layer and said base poly layer together selectively form a dummy capacitor.

9. The PIP capacitor structure integrated with the BJT of claim 8, wherein said dummy capacitor forms a capacitor array with a capacitor.

10. The PIP capacitor structure integrated with the BJT of claim 9, wherein said capacitor array forms a tunable code array.

* * * * *